(12) United States Patent
Truong et al.

(10) Patent No.: US 8,324,934 B1
(45) Date of Patent: Dec. 4, 2012

(54) PROGRAMMABLE BUFFER

(75) Inventors: Keith Truong, San Jose, CA (US); John Schadt, Bethlehem, PA (US); Ravi Lall, Portland, OR (US); William Andrews, Macungie, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/007,688

(22) Filed: Jan. 17, 2011

(51) Int. Cl.
*H03K 19/094* (2006.01)

(52) U.S. Cl. .............................. 326/83; 326/68; 327/333

(58) Field of Classification Search .......................... None
See application file for complete search history.

(56) References Cited

U.S. PATENT DOCUMENTS

| | | | |
|---|---|---|---|
| 5,059,835 A | 10/1991 | Lauffer et al. | |
| 5,408,147 A * | 4/1995 | Yarbrough et al. | 326/68 |
| 5,418,474 A * | 5/1995 | Davis et al. | 326/27 |
| 6,052,020 A * | 4/2000 | Doyle | 327/539 |
| 6,300,810 B1 * | 10/2001 | Hardee | 327/206 |
| 6,870,413 B1 | 3/2005 | Chang et al. | |
| 6,965,251 B1 | 11/2005 | Tran et al. | |
| 6,970,015 B1 | 11/2005 | Chan et al. | |
| 7,023,238 B1 | 4/2006 | Camarota | |
| 7,382,168 B2 | 6/2008 | Bhattacharya et al. | |
| 7,579,898 B2 * | 8/2009 | Soldera et al. | 327/512 |
| 7,612,588 B2 * | 11/2009 | Kimura | 327/143 |

* cited by examiner

*Primary Examiner* — Crystal L Hammond
(74) *Attorney, Agent, or Firm* — Mendelsohn, Drucker & Associates, P.C.

(57) ABSTRACT

In one embodiment of the invention, a programmable device, such as an FPGA, has a programmable input buffer with a VCCIO-powered buffer stage for high-voltage signaling and a VCC-powered buffer stage for low-voltage signaling. In addition to a main driver section, the VCCIO-powered buffer stage has a mixed-mode section for handling multiple different over-drive and multiple different under-drive conditions, a hysteresis section for providing multiple different trip-point hysteresis modes of operation, and a level-shifting section with look-ahead circuitry that enables the main driver section to be implemented with low-power, high-threshold devices, while still enabling the VCCIO-powered buffer stage to operate with low skew and high speed.

21 Claims, 8 Drawing Sheets

| TABLE I. DEVICE CHARACTERISTICS ||
| --- | --- |
| DEVICE (FIGURE) | CHARACTERISTICS |
| Inverter IINS_EN (FIG. 2) | p=1.3/0.35; n=1/0.35 |
| Transistor MP1A (FIG. 3) | 2.75/0.35 |
| Transistors MN1A, MN1B (FIG. 3) | 3.3/0.35 |
| Transistors MP1B, MN1C (FIG. 4) | 5.6/0.35 |
| Transistor MP1C (FIG. 4) | 2*7.02/0.35 |
| Transistor MN1D (FIG. 4) | 2*5.6/0.35 |
| Inverters IOD1, IOD2, IUD1, IUD2 (FIG. 4) | p=1/0.35; n=1/0.35 |
| Transistors MPOD1PU, MPOD2PU, MNUD1PD, MNUD2PD (FIG. 4) | 1/0.35 |
| Transmission Gates MTOD1, MTUD1 (FIG. 4) | n=1/0.35; p=2/0.35 |
| Transmission Gates MTOD2, MTUD2 (FIG. 4) | n=1.5/0.35; p=3/0.35 |
| Transistor MP2A (FIG. 5) | 2*5.5/0.35 |
| Transistors MP2B, MP2C (FIG. 5) | 5.5/0.35 |
| Transistors MN2A, MN2B (FIG. 5) | 5.75/0.35 |
| Transistor MN2C (FIG. 5) | 2*5.75/0.35 |
| Transistor MP3 (FIG. 5) | 1/0.35 |
| Transistors MP4, MN4 (FIG. 5) | 2*3.48/0.35 |
| Transistor MP5A (FIG. 6) | 2*2.01/0.45 |
| Transistor MN5A (FIG. 6) | 2/0.45 |
| Transistor MP5 (FIG. 6) | 2*3.6/0.45 |
| Transistor MN5 (FIG. 6) | 2*1.8/0.45 |
| Inverter IINT (FIG. 6) | p=2*1.25/0.065; n=2*.94/0.065 |
| Transistor MNAUX (FIG. 6) | 2/0.45 |
| Inverter ISIO (FIG. 6) | p=7*1.44/0.065; n=6*1.25/0.065 |
| Transistor MP6 (FIG. 7) | 2*4/0.35 |
| Transistors MN6A, MN6B (FIG. 7) | 2.52/0.35 |
| Transistor MP7 (FIG. 7) | 1/0.35 |
| Inverter I7 (FIG. 7) | p=1/0.065; n=0.4/0.065 |
| Inverter I8 (FIG. 7) | p=2.52/0.065; n=2/0.065 |
| Inverter I9 (FIG. 7) | p=2*4/0.065; n=3.54/0.065 |

PROGRAMMABLE BUFFER

TECHNICAL FIELD

The present invention relates to electronics, and, more specifically but not exclusively, to the programmable input buffers.

BACKGROUND

This section introduces aspects that may help facilitate a better understanding of the invention. Accordingly, the statements of this section are to be read in this light and are not to be understood as admissions about what is prior art or what is not prior art.

Conventional programmable devices, such as field-programmable gate arrays (FPGAs), are capable of communicating with external devices using different signaling schemes having various voltage levels, e.g., 1.2V, 1.5V, 1.8V, 2.5, and 3.3V. To handle incoming signals at these different voltage levels, conventional FPGAs are implemented with programmable input buffers that can be selectively programmed to operate at different voltage levels. In addition to a core power supply VCC and an input/output (I/O) power supply VCCIO, some FPGAs include an auxiliary power supply VCCAUX of 3.3V or 2.5V. For a programmable device having VCC, VCCIO, and VCCAUX power supplies, an input buffer might have three different buffer stages: a VCC-powered buffer stage designed to be programmably selected to handle low-voltage signaling (e.g., 1.2V), a VCCIO-powered buffer stage designed to be programmably selected to handle mid-voltage signaling (e.g., 1.5V and 1.8V), and a VCCAUX-powered buffer stage designed to be programmably selected to handle high-voltage signaling (e.g., 2.5V and 3.3V).

SUMMARY

Certain embodiments of the present invention are directed to programmable devices having programmable input buffers with only two buffer stages: a VCC-powered buffer stage designed to be programmably selected to handle low-voltage signaling (e.g., 1.2V) and a VCCIO-powered buffer stage designed to be programmably selected to handle both mid-voltage signaling (e.g., 1.5V and 1.8V) and high-voltage signaling (e.g., 2.5V and 3.3V). To support high-voltage signaling, the VCCIO-powered buffer stage is designed with overdrive capabilities.

In one embodiment, an integrated circuit has a buffer comprising a main driver section and a hysteresis section. The main driver section has a main driver input node and a main driver output node. The hysteresis section is (i) connected to the main driver input node and the main driver output node and (ii) selectively configurable to provide any of a plurality of different levels of trip-point hysteresis for the buffer.

In another embodiment, an integrated circuit has a buffer comprising a main driver section and mixed-mode section. The main driver section has a main driver input node and a main driver output node. The mixed-mode section is (i) connected to the main driver input node and the main driver output node and (ii) selectively configurable to provide any of a plurality of different mixed modes of operation for the buffer.

In yet another embodiment, an integrated circuit has a buffer comprising a main driver section and a level-shifting section. The main driver section has a main driver input node and a main driver output node. The level-shifting section has (i) an input node at a first voltage domain connected to the main driver output node and (ii) an output node at a second voltage domain different from the first voltage domain. The level-shifting section comprises level-shifting circuitry and look-ahead circuitry. The level-shifting circuitry has an input node at the first voltage domain and an output node at the second voltage domain. The look-ahead circuitry is (i) connected to the input node of the level-shifting section and (ii) connected to a downstream node at the second voltage domain, wherein the look-ahead circuitry speeds up switching of the downstream node based on a transition at the input node of the level-shifting section.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 8 shows Table I, which identifies the characteristics of the various transistors, inverters, and transmission gates of the input buffer of FIGS. 2-7.

DETAILED DESCRIPTION

Figure 1:
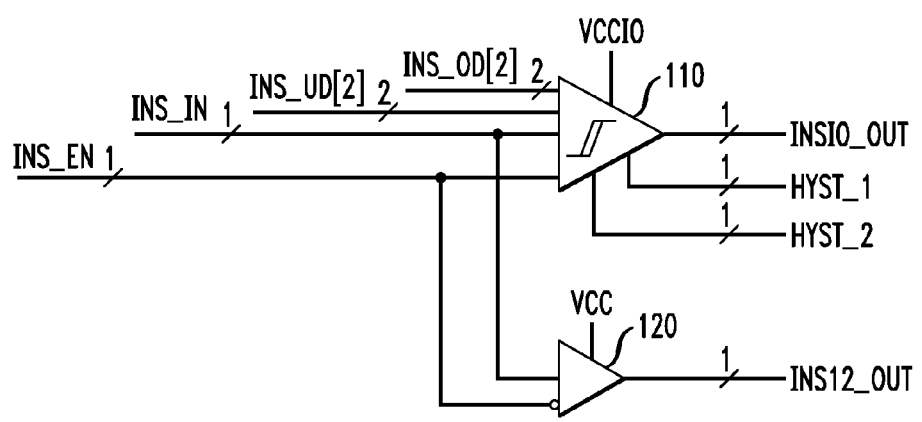
FIG. 1 shows a high-level schematic diagram of a programmable input buffer according to one embodiment of the present invention.

FIG. 1 shows a high-level schematic diagram of a programmable input buffer 100 according to one embodiment of the present invention. Input buffer 100 is part of a programmable device (not shown), such as a field-programmable gate array (FPGA), that may have multiple instances of input buffer 100. Input buffer 100 receives input data signal INS_IN and, depending on how input buffer 100 is programmed, provides either (i) output data signal INSIO_OUT or (ii) output data signal INS12_OUT.

Input buffer 100 has two buffers stages: VCCIO-powered buffer stage 110, where I/O power supply VCCIO ranges from about 1.2V to about 3.3V, and VCC-powered buffer stage 120, where core power supply VCC is about 1.2V. Stage control signal INS_EN is used to selectively enable or disable buffer stages 110 and 120. When stage control signal INS_EN is enabled, VCCIO-powered buffer stage 110 is enabled to provide output data signal INSIO_OUT in the VCC-voltage domain and VCC-powered buffer stage 120 is disabled. On the other hand, when stage control signal INS_EN is disabled, VCCIO-powered buffer stage 110 is disabled and VCC-powered buffer stage 120 is enabled to provide output data signal INS12_OUT in the VCC-voltage domain. Note that, when VCCIO-powered buffer stage 110 is disabled, then output data signal INSIO_OUT is driven low. Similarly, when VCC-powered buffer stage 120 is disabled, then output data signal INS12_OUT is also driven low.

In addition to the VCCIO level varying from about 1.2V to about 3.3V, the signaling level (i.e., the peak voltage of input data signal INS_IN) can also vary from about 1.2V to about 3.3V, independent of the VCCIO level. Typical VCCIO and signaling levels are 1.2V, 1.5V, 1.8V, 2.5V, and 3.3V. Depending on the VCCIO level and the signaling level, stage control signal INS_EN will be set (e.g., by software) to selectively enable and disable VCCIO-powered buffer stage 110 and VCC-powered buffer stage 120.

The term "matched mode" refers to situations when the VCCIO level is equal to the signaling level. The term "mixed mode" refers to situations when the VCCIO level differs from the signaling level.

In one possible implementation, whenever the signaling level is 3.3V, 2.5V, 1.8V, or 1.5V, stage control signal INS_EN is enabled to enable VCCIO-powered buffer stage 110 and disable VCC-powered buffer stage 120, and, whenever the signaling level is 1.2V, stage control signal INS_EN is disabled to disable VCCIO-powered buffer stage 110 and enable VCC-powered buffer stage 120. In another possible implementation, the same scheme is applied, except when the signaling level is 1.5V and no hysteresis is required. (Hysteresis is described below.) In that case, stage control signal INS_EN is disabled to disable VCCIO-powered buffer stage 110 and enable VCC-powered buffer stage 120.

Two-bit over-drive control signal INS_OD[2] controls whether or not VCCIO-powered buffer stage 110 is programmed in an over-drive mode. Over-drive is when the peak voltage of input data signal INS_IN exceeds the VCCIO level, for example, when the input data signal is a 3.3V LVCMO33 signal and VCCIO=1.8V. VCCIO-powered buffer stage 110 supports three different over-drive modes. When the first bit INS_OD1 of the over-drive control signal is enabled and the second bit INS_OD2 of the over-drive control signal is disabled, then buffer stage 110 is configured in a first over-drive mode in which the peak voltage of input data signal INS_IN exceeds the VCCIO level by a first over-drive voltage level. When first bit INS_OD1 is disabled and second bit INS_OD2 is enabled, then buffer stage 110 is configured in a second over-drive mode in which the peak voltage of input data signal INS_IN exceeds the VCCIO level by a second over-drive voltage level that is greater than the first over-drive voltage level. When first bit INS_OD1 and second bit INS_OD2 are both enabled, then buffer stage 110 is configured in a third over-drive mode in which the peak voltage of input data signal INS_IN exceeds the VCCIO level by a third over-drive voltage level that is greater than the second over-drive voltage level.

Two-bit under-drive control signal INS_UD[2] controls whether or not VCCIO-powered buffer stage 110 is programmed in an under-drive mode. Under-drive is when the peak voltage of input data signal INS_IN is lower than the VCCIO level, for example, when the input data signal is a 1.5V LVCMO15 signal and VCCIO=2.5V. When the first bit INS_UD1 of the under-drive control signal is enabled and the second bit INS_UD2 of the under-drive control signal is disabled, then buffer stage 110 is configured in a first under-drive mode in which the VCCIO level exceeds the peak voltage of input data signal INS_IN by a first under-drive voltage level. When first bit INS_UD1 is disabled and second bit INS_UD2 is enabled, then buffer stage 110 is configured in a second under-drive mode in which the VCCIO level exceeds the peak voltage of input data signal INS_IN by a second under-drive voltage level that is greater than the first under-drive voltage level. When first bit INS_UD1 and second bit INS_UD2 are both enabled, then buffer stage 110 is configured in a third under-drive mode in which the VCCIO level exceeds the peak voltage of input data signal INS_IN by a third under-drive voltage level that is greater than the second under-drive voltage level.

Note that, when over-drive control signal INS_OD[2] and under-drive control signal INS_UD[2] are both disabled (e.g., all four bits are disabled), then the peak voltage of input data signal is equal to VCCIO. Note further that control signals INS_OD[2] and INS_UD[2] are never both enabled (e.g., at least one bit is enabled in each control signal) at the same time.

Hysteresis control signals HYST_1 and HYST_2 control whether or not VCCIO-powered buffer stage 110 is programmed in a trip-point hysteresis mode. Trip-point hysteresis is when there is a non-zero difference between the trip point (i.e., switching threshold) when the buffer transitions from low to high and the trip point when the buffer transitions from high to low. Assume that VCCIO-powered buffer stage 110 transitions from low to high at trip-point voltage $V_{L2H}$ and from high to low at trip-point voltage $V_{H2L}$. When trip-point hysteresis mode is disabled (i.e., both HYST_1 and HYST_2 are disabled), then trip-points $V_{L2H}$ and $V_{H2L}$ are both substantially equal to the voltage level midway between VCCIO and ground (e.g., VCCIO/2), and the trip-point difference ($V_{L2H}-V_{H2L}$) is substantially zero. In a trip-point hysteresis mode, either ($V_{L2H}$>VCCIO/2) or ($V_{H2L}$<VCCIO/2) or both, such that the trip-point difference ($V_{L2H}-V_{H2L}$) is not zero.

VCCIO-powered buffer stage 110 supports three different trip-point hysteresis modes: two small-hysteresis modes and one large-hysteresis mode. When hysteresis control signal HYST_1 is enabled and hysteresis control signal HYST_2 is disabled, then buffer stage 110 is configured in a first small-hysteresis mode, in which ($V_{L2H}$>VCCIO/2) and ($V_{H2L}$=VCCIO/2). When control signal HYST_1 is disabled and control signal HYST_2 is enabled, then buffer stage 110 is configured in a second small-hysteresis mode, in which ($V_{L2H}$=VCCIO/2) and ($V_{H2L}$<VCCIO/2). When control signal HYST_1 and control signal HYST_2 are both enabled, then buffer stage 110 is configured in the large-hysteresis mode, in which ($V_{L2H}$>VCCIO/2) and ($V_{H2L}$<VCCIO/2). Note that, in the large-hysteresis mode, the trip-point difference ($V_{L2H}-V_{H2L}$) is approximately equal to the sum of the trip-point differences of the first and second small-hysteresis modes.

Figure 2:
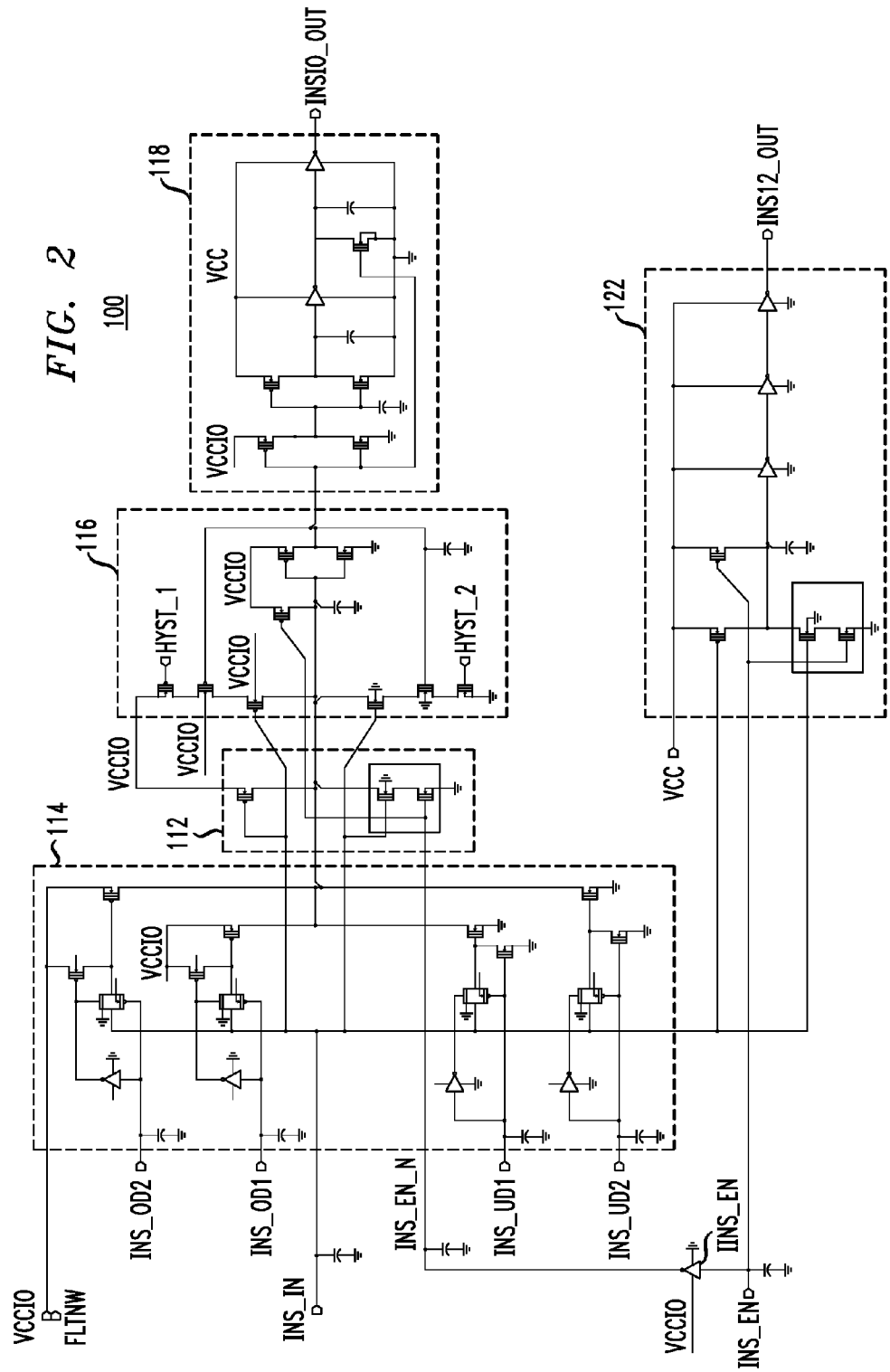
FIG. 2 shows a more-detailed schematic diagram of the programmable input buffer of FIG. 1.

FIG. 2 shows a more-detailed schematic diagram of programmable input buffer 100 of FIG. 1. In FIG. 2, sections 112-118 correspond to VCCIO-powered buffer stage 110 of FIG. 1, while section 122 corresponds to VCC-powered buffer stage 120 of FIG. 1.

Section 112 is the main driver section of VCCIO-powered buffer stage 110. Mixed-mode section 114 controls whether or not buffer stage 110 operates in an over-drive mode or an under-drive mode. Hysteresis section 116 controls whether or not buffer stage 110 operates in the first small-hysteresis mode, the second small-hysteresis mode, or the large-hysteresis mode. Level-shifting section 118 provides a voltage-domain crossing from the VCCIO-voltage domain to the VCC-voltage domain to ensure that output data signal INSIO_OUT is in the VCC-voltage domain. Level-shifting section 118 has look-ahead circuitry that enable VCCIO-powered buffer stage 110 to switch quickly with low skew and low power consumption using high-threshold devices for at least some of the transistors used to implement buffer stage 110. Each of sections 112-118 and 122 is shown in one of FIGS. 3-7 and described in one of the following sections of the specification.

Note that, in FIGS. 2-7, the depicted capacitors correspond to intrinsic, parasitic capacitances for simulation purposes and do not represent extrinsic devices.

Note further that, in addition to the VCCIO and VCC power supply voltages, input buffer 100 also receives floating N-well voltage FLTNW, which is generated by circuitry (not shown in the figures) that sets FLTNW to the higher of the VCCIO voltage level and the peak voltage of input data signal INS_IN.

Main Driver Section

Figure 3:
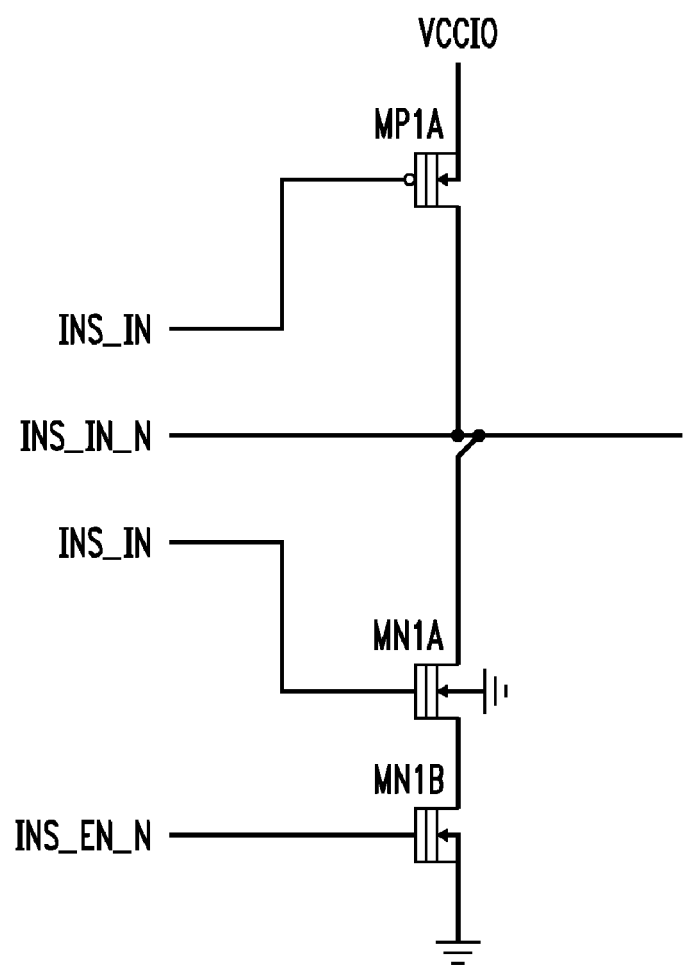
FIG. 3 shows a detailed schematic diagram of the main driver section of the VCCIO-powered buffer stage of FIG. 2.

FIG. 3 shows a detailed schematic diagram of main driver section 112 of VCCIO-powered buffer stage 110 of FIG. 2. As shown in FIG. 2, inverted stage control signal INS_EN_N is generated by inverter IINS_EN based on stage control signal INS_EN. When stage control signal INS_EN is disabled (e.g., high), then inverted stage control signal INS_EN_N is low, transistor MN1B is off, and main driver section 112 is disabled. When stage control signal INS_EN is enabled (e.g., low), then inverted stage control signal INS_EN_N is high, transistor MN1B is on, and main driver section 112 is enabled. When enabled, transistors MP1A and MN1A of main driver section 112 function as an inverter that generates inverted input data signal INS_IN_N based on input data signal INS_IN. In particular, when input data signal INS_IN is low, then transistor MP1A is on, transistor MN1A is off, and inverted input data signal INS_IN_N is driven towards VCCIO. When input data signal INS_IN is high, then transistor MP1A is off, transistor MN1A is on, and inverted input data signal INS_IN_N is driven towards ground.

Mixed-Mode Section

Figure 4:
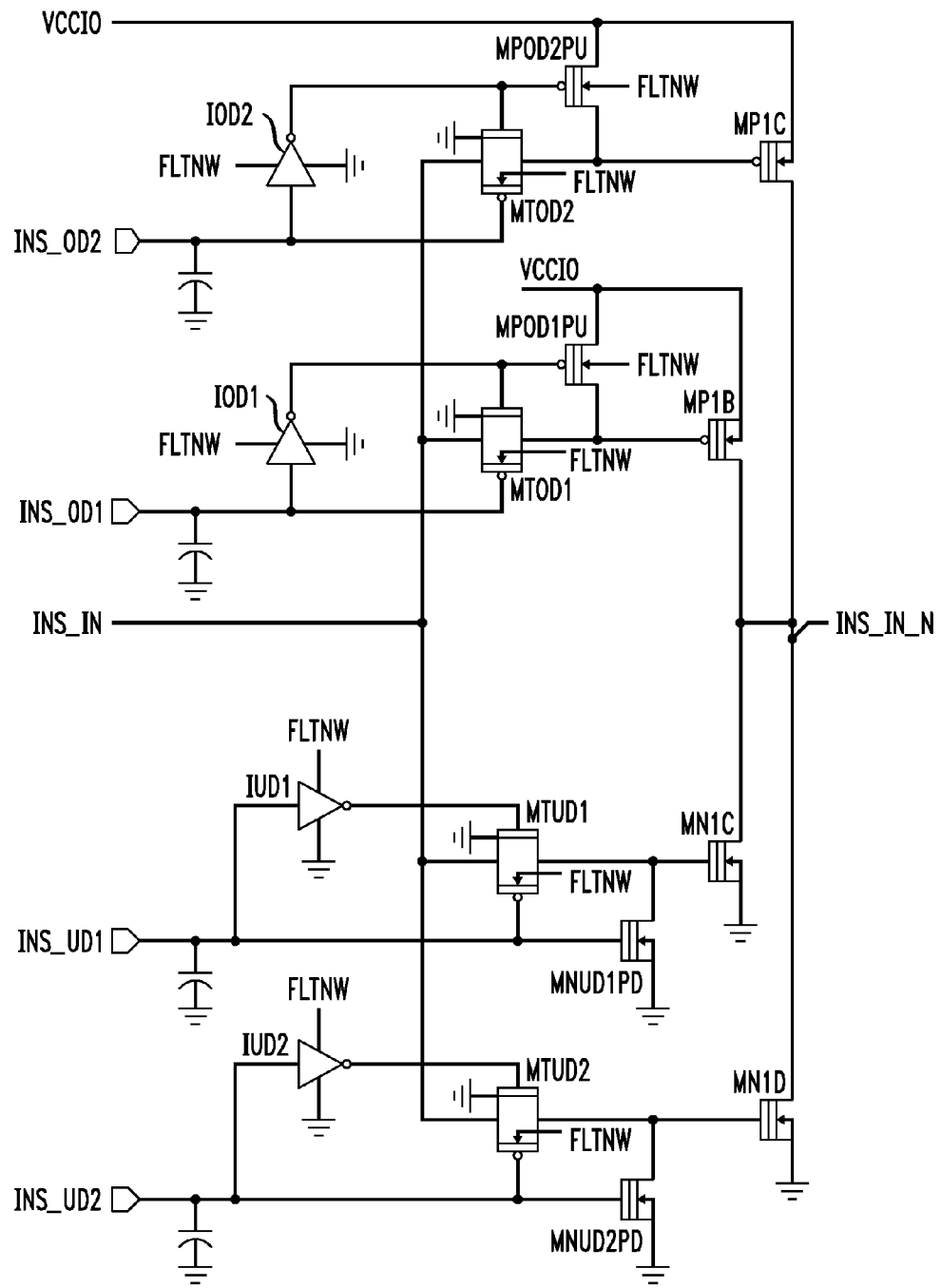
FIG. 4 shows a detailed schematic diagram of the mixed-mode section of the VCCIO-powered buffer stage of FIG. 2.

FIG. 4 shows a detailed schematic diagram of mixed-mode section 114 of VCCIO-powered buffer stage 110 of FIG. 2. Mixed-mode section 114 enables VCCIO-powered buffer stage 110 to operate in mixed-mode conditions where the peak voltage of input data signal INS_IN is different from the VCCIO voltage level. When VCCIO is greater than the peak voltage of input data signal INS_IN, then an under-drive condition exists. Under-drive control signals INS_UD1 and INS_UD2 are used to handle under-drive conditions. When VCCIO is less than the peak voltage of input data signal INS_IN, then an over-drive condition exists. Over-drive control signals INS_OD1 and INS_OD2 are used to handle over-drive conditions.

In particular, when over-drive control signal INS_OD1 is disabled (e.g., high), then first over-drive transmission gate MTOD1 is closed and first over-drive pull-up transistor MPOD1PU is on (due to first over-drive inverter IOD1), which ensures that first over-drive transistor MP1B is off. When over-drive control signal INS_OD1 is enabled (e.g., low), then first over-drive pull-up transistor MPOD1PU is off and first over-drive transmission gate MTOD1 is open, which allows input data signal INS_IN to be applied to the gate of first over-drive transistor MP1B. Thus, when input data signal INS_IN is low, then first over-drive transistor MP1B assists transistor MP1A in main driver section 112 of FIG. 3 in driving inverted input data signal INS_IN_N towards VCCIO. Inverter IOD1, transmission gate MTOD1, and pull-up transistor MPOD1PU form circuitry that enables transistor MP1B to function as a first switched P-type device whose gate is selectively connected to receive input data signal INS_IN (i.e., transistor MP1B is selectively switched in).

Similarly, when over-drive control signal INS_OD2 is disabled (e.g., high), then second over-drive transmission gate MTOD2 is closed and second over-drive pull-up transistor MPOD2PU is on (due to second over-drive inverter IOD2), which ensures that second over-drive transistor MP1C is off. When over-drive control signal INS_OD2 is enabled (e.g., low), then second over-drive pull-up transistor MPOD2PU is off and second over-drive transmission gate MTOD2 is open, which allows input data signal INS_IN to be applied to the gate of second over-drive transistor MP1C. Thus, when input data signal INS_IN is low, then second over-drive transistor MP1C assists transistor MP1A in main driver section 112 of FIG. 3 in driving inverted input data signal INS_IN_N towards VCCIO. Inverter IOD2, transmission gate MTOD2, and pull-up transistor MPOD2PU form circuitry that enables transistor MP1C to function as a second switched P-type device whose gate is selectively connected to receive input data signal INS_IN (i.e., transistor MP1C is selectively switched in).

In one implementation, second over-drive transistor MP1C is twice as large as first over-drive transistor MP1B. When control signal INS_OD1 is enabled and control signal INS_OD2 is disabled, then mixed-mode section 114 is configured in the first over-drive mode with strength 1×. When control signal INS_OD1 is disabled and control signal INS_OD2 is enabled, then mixed-mode section 114 is configured in the second over-drive mode with strength 2×. When both control signal INS_OD1 and control signal INS_OD2 are enabled, then mixed-mode section 114 is configured in the third over-drive mode with strength 3×.

Analogously, when under-drive control signal INS_UD1 is disabled (e.g., high), then first under-drive transmission gate MTUD1 is closed and first under-drive pull-down transistor MNUD1PD is on (due to first under-drive inverter IUD1), which ensures that first under-drive transistor MN1C is off. When under-drive control signal INS_UD1 is enabled (e.g., low), then first under-drive pull-down transistor MNUD1PD is off and first under-drive transmission gate MTUD1 is open, which allows input data signal INS_IN to be applied to the gate of first under-drive transistor MN1C. Thus, when input data signal INS_IN is high, then first under-drive transistor MN1C assists transistor MN1A in main driver section 112 of FIG. 3 in driving inverted input data signal INS_IN_N towards ground. Inverter IUD1, transmission gate MTUD1, and pull-down transistor MPUD1PD form circuitry that enables transistor MN1C to function as a first switched N-type device whose gate is selectively connected to receive input data signal INS_IN (i.e., transistor MN1C is selectively switched in).

Similarly, when under-drive control signal INS_UD2 is disabled (e.g., high), then second under-drive transmission gate MTUD2 is closed and second under-drive pull-down transistor MNUD2PD is on (due to second under-drive inverter IUD2), which ensures that second under-drive transistor MN1D is off. When under-drive control signal INS_UD2 is enabled (e.g., low), then second under-drive pull-down transistor MNUD2PD is off and second under-drive transmission gate MTUD2 is open, which allows input data signal INS_IN to be applied to the gate of second under-drive transistor MN1D. Thus, when input data signal INS_IN is high, then second under-drive transistor MN1D assists transistor MN1A in main driver section 112 of FIG. 3 in driving inverted input data signal INS_IN_N towards ground. Inverter IUD2, transmission gate MTUD2, and pull-down transistor MPUD2PD form circuitry that enables transistor MN1D to function as a second switched N-type device whose gate is selectively connected to receive input data signal INS_IN (i.e., transistor MN1D is selectively switched in).

In one implementation, second under-drive transistor MN1D is twice as large as first under-drive transistor MN1C.

When control signal INS_UD1 is enabled and control signal INS_UD2 is disabled, then mixed-mode section 114 is configured in the first under-drive mode with strength 1×. When control signal INS_UD1 is disabled and control signal INS_UD2 is enabled, then mixed-mode section 114 is configured in the second under-drive mode with strength 2×. When both control signal INS_UD1 and control signal INS_UD2 are enabled, then mixed-mode section 114 is configured in the third under-drive mode with strength 3×.

Hysteresis Section

Figure 5:
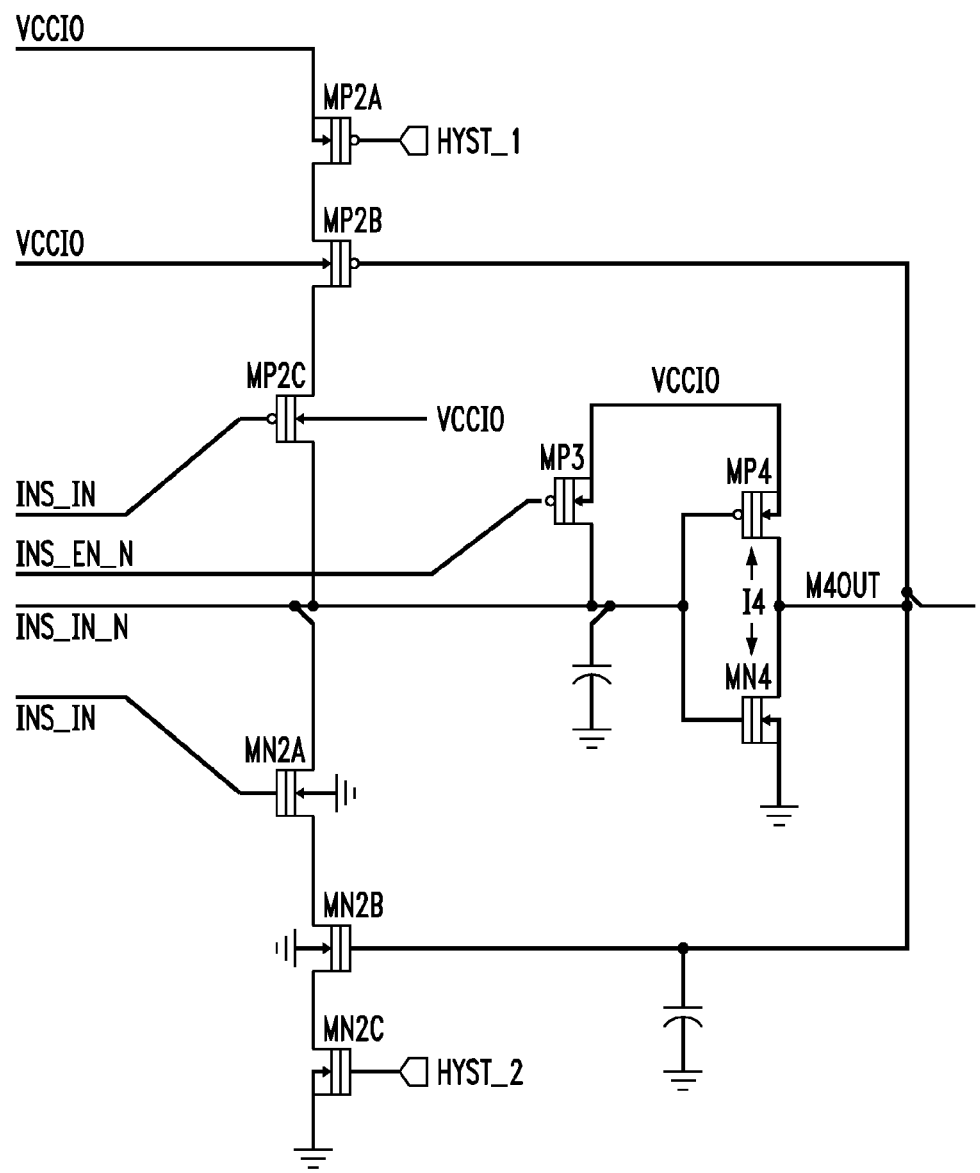
FIG. 5 shows a detailed schematic diagram of the hysteresis section of the VCCIO-powered buffer stage of FIG. 2.

FIG. 5 shows a detailed schematic diagram of hysteresis section 116 of VCCIO-powered buffer stage 110 of FIG. 2. Hysteresis section 116 enables VCCIO-powered buffer stage 110 to operate at different trip-point hysteresis levels.

When stage control signal INS_EN is disabled (e.g., high), then inverted stage control signal INS_EN_N is low and weak pull-up transistor MP3 is on, which drives inverted input data signal INS_IN_N toward VCCIO, which, in turn, causes the inverter (I4) formed by transistors MP4 and MN4 to drive hysteresis section output signal M4OUT toward ground. Thus, when stage control signal INS_EN is disabled, then hysteresis section 116, like main driver section 112, is disabled.

When stage control signal INS_EN is enabled (e.g., low), then inverted stage control signal INS_EN_N is high, transistor MP3 is off, and inverter I4 inverts inverted input data signal INS_IN_N to generate hysteresis section output signal M4OUT. Thus, when stage control signal INS_EN is enabled, then hysteresis section 116, like main driver section 112, is enabled.

P-type transistors MP2A, MP2B, and MP2C form a P leg of hysteresis section 116, while N-type transistors MN2A, MN2B, and MN2C form an N leg of hysteresis section 116.

Note that, in one possible implementation, VCCIO-powered buffer stage 110 is never configured for both mixed-mode operation and non-zero hysteresis operation.

Zero-Hysteresis Mode

With hysteresis section 116 enabled, when hysteresis control signal HYST_1 is disabled (e.g., high) and hysteresis control signal HYST_2 is also disabled (e.g., low), then first hysteresis control transistor MP2A and second hysteresis control transistor MN2C are both turned off. In this zero-hysteresis mode, the output of inverter I4 is not affected by any of transistors MP2B, MP2C, MN2A, or MN2B. In that case, assuming that PMOS and NMOS drive strengths are balanced in the rest of VCCIO-powered buffer stage 110, then the low-to-high trip-point voltage level $V_{L2H}$ and the high-to-low trip-point voltage level $V_{H2L}$ of input data signal INS_IN at which output signal M4OUT will transition will both be substantially equal to the midway voltage level VCCIO/2.

First Small-Hysteresis Mode

With hysteresis section 116 enabled, when first hysteresis control signal HYST_1 is enabled (e.g., low) and second hysteresis control signal HYST_2 is disabled (e.g., low), then first hysteresis control transistor MP2A is turned on and second hysteresis control transistor MN2C is turned off. When input data signal INS_IN is low, then inverted input data signal INS_IN_N is high, output signal M4OUT is low, transistors MP2C and MP2B are on, and transistors MN2A and MN2B are off.

As input data signal INS_IN transitions from low to high, transistor MP2C will turn off and transistor MN2A will turn on. In the meantime, main driver section 112 will drive inverted input data signal INS_IN_N low, which will cause inverter I4 to drive output signal M4OUT high, which, in turn, will turn off transistor MP2B and turn on transistor MN2B. With transistor MP2A on, transistors MP2A, MP2B, and MP2C increase the PMOS strength driving inverted input data signal INS_IN_N, which causes output signal M4OUT to transition from low to high later, which corresponds to an increase in the low-to-high trip-point voltage level $V_{L2H}$ above the midway voltage level VCCIO/2.

As input data signal INS_IN transitions from high to low, transistor MP2C will turn on and transistor MN2A will turn off. In the meantime, main driver section 112 will drive inverted input data signal INS_IN_N high, which will cause inverter I4 to drive output signal M4OUT low, which, in turn, will turn on transistor MP2B and turn off transistor MN2B. With hysteresis control transistor MN2C off, there is no change in the NMOS strength driving inverted input data signal INS_IN_N. As a result, the high-to-low trip-point voltage level $V_{H2L}$ will not change from the midway voltage level VCCIO/2.

As such, in this first small-hysteresis mode, the low-to-high trip-point voltage level $V_{L2H}$ is greater than the high-to-low trip-point voltage level $V_{H2L}$, which is itself substantially equal to the midway voltage level VCCIO/2.

Second Small-Hysteresis Mode

With hysteresis section 116 enabled, when first hysteresis control signal HYST_1 is disabled (e.g., high) and second hysteresis control signal HYST_2 is enabled (e.g., high), then first hysteresis control transistor MP2A is turned off and second hysteresis control transistor MN2C is turned on. When input data signal INS_IN is low, then inverted input data signal INS_IN_N is high, output signal M4OUT is low, transistors MP2C and MP2B are on, and transistors MN2A and MN2B are off.

As input data signal INS_IN transitions from low to high, transistor MP2C will turn off and transistor MN2A will turn on. In the meantime, main driver section 112 will drive inverted input data signal INS_IN_N low, which will cause inverter I4 to drive output signal M4OUT high, which, in turn, will turn off transistor MP2B and turn on transistor MN2B. With hysteresis control transistor MP2A off, there is no change in the PMOS strength driving inverted input data signal INS_IN_N. As a result, the low-to-high trip-point voltage level $V_{L2H}$ will not change from the midway voltage level VCCIO/2.

As input data signal INS_IN transitions from high to low, transistor MP2C will turn on and transistor MN2A will turn off. In the meantime, main driver section 112 will drive inverted input data signal INS_IN_N high, which will cause inverter I4 to drive output signal M4OUT low, which, in turn, will turn on transistor MP2B and turn off transistor MN2B. With transistor MN2C on, transistors MN2A, MN2B, and MN2C increase the NMOS strength driving inverted input data signal INS_IN_N, which causes output signal M4OUT to transition from high to low later, which corresponds to an decrease in the low-to-high trip-point voltage level $V_{L2H}$ below the midway voltage level VCCIO/2.

As such, in this second small-hysteresis mode, the high-to-low trip-point voltage level $V_{H2L}$ is less than the low-to-high trip-point voltage level $V_{L2H}$, which is itself substantially equal to the midway voltage level VCCIO/2.

Large-Hysteresis Mode

With hysteresis section 116 enabled, when first hysteresis control signal HYST_1 is enabled (e.g., low) and second hysteresis control signal HYST_2 is also enabled (e.g., high), then first hysteresis control transistor MP2A and second hysteresis control transistor MN2C are both turned on.

When input data signal INS_IN is low, then inverted input data signal INS_IN_N is high, output signal M4OUT is low, transistors MP2C and MP2B are on, and transistors MN2A and MN2B are off.

With transistor MP2A on, transistors MP2A, MP2B, and MP2C increase the PMOS strength driving inverted input data signal INS_IN_N, which causes output signal M4OUT to transition from low to high later, which corresponds to an increase in the low-to-high trip-point voltage level $V_{L2H}$ above the midway voltage level VCCIO/2.

With transistor MN2C on, transistors MN2A, MN2B, and MN2C increase the NMOS strength driving inverted input data signal INS_IN_N, which causes output signal M4OUT to transition from high to low later, which corresponds to an decrease in the low-to-high trip-point voltage level $V_{L2H}$ below the midway voltage level VCCIO/2.

As such, in this large-hysteresis mode, the low-to-high trip-point voltage level $V_{L2H}$ is greater than the midway voltage level VCCIO/2, and the high-to-low trip-point voltage level $V_{H2L}$ is less than the midway voltage level VCCIO/2.

Level-Shifting Section with Look-Ahead Circuitry

Figure 6:
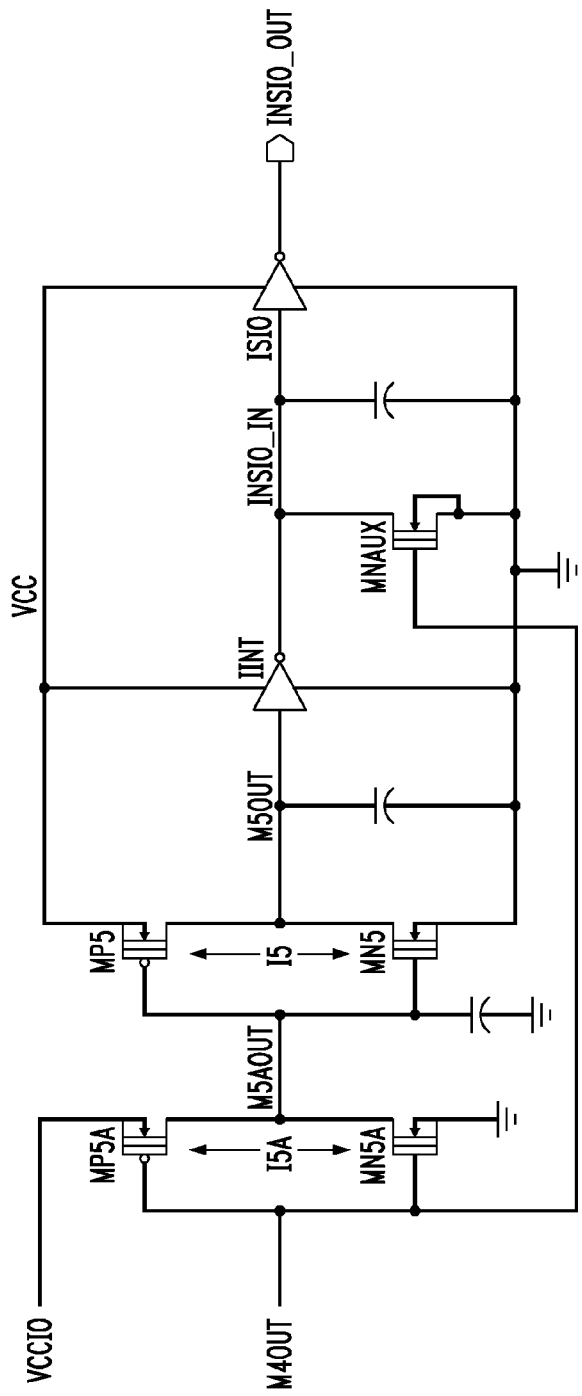
FIG. 6 shows a detailed schematic diagram of the level-shifting section of the VCCIO-powered buffer stage of FIG. 2.

FIG. 6 shows a detailed schematic diagram of level-shifting section 118 of VCCIO-powered buffer stage 110 of FIG. 2. Level-shifting section 118 provides a voltage-domain crossing from the VCCIO-voltage domain to the VCC-voltage domain. In addition, level-shifting section 118 has look-ahead circuitry that enables VCCIO-powered buffer stage 110 to switch quickly with low skew and low power consumption using high-threshold devices for at least some of the transistors in VCCIO-powered buffer stage 110.

In particular, inverter I5A, formed by transistors MP5A and MN5A, inverts hysteresis section output signal M4OUT into inverter output signal M5AOUT in the VCCIO-voltage domain. Inverter I5, formed by transistors MP5 and MN5, provides the voltage-domain crossing by receiving inverter output signal M5AOUT in the VCCIO-voltage domain and generating inverted output signal M5OUT in the VCC-voltage domain. In addition, inverter IINT inverts inverter output signal M5OUT to generate signal INSIO_IN, and inverter ISIO inverts signal INSIO_IN into VCC-powered buffer stage output data signal INSIO_OUT, all in the VCC-voltage domain.

In addition to transistors MP5A and MN5A, inverter I5A also includes auxiliary transistor MNAUX, which constitutes the look-ahead circuitry of level-shifting section 118. When signal M4OUT is low, then transistor MP5A is on and transistors MN5A and MNAUX are off, which drives signal M5AOUT toward VCCIO (high), which, in turn, turns transistor MP5 off and transistor MN5 on, which drives signal M5OUT toward ground (low), which, in turn, drives signal INSIO_IN toward VCC (high) via inverter IINT.

As signal M4OUT transitions from low to high, transistor MP5A turns off and transistors MN5A and MNAUX turn on. Turning transistor MP5A off and transistor MN5A on, drives signal M5AOUT toward ground (low), which, in turn, turns transistor MP5 on and transistor MN5 off, which drives signal M5OUT toward VCC (high), which, in turn, drives signal INSIO_IN toward ground (low) via inverter IINT. By turning on auxiliary transistor MNAUX based on signal M4OUT going high, auxiliary transistor MNAUX begins to drive signal INSIO_IN toward ground even before inverter IINT trips based on signal M5OUT going high. This constitutes a look-ahead feature that accelerates the speed at which signal INSIO_IN transitions from high to low and, in turn, accelerates the speed at which output data signal INSIO_OUT transitions from low to high.

This look-ahead circuitry enables certain devices in VCCIO-powered buffer stage 110 to be implemented using high-threshold transistors, which otherwise would slow down the buffer stage. Using high-threshold transistors provides advantages in terms of smaller layout area, lower power consumption, and less sensitivity to PVT (process, voltage, temperature) variations. For example, in one possible implementation, transistors MP1A and MN1A of main driver section 112 and transistors MP2A-C, MN2A-C, MP3, MP4, and MN4 of hysteresis section 116 can be implemented using high-threshold devices, with the look-ahead circuitry of level-shifting section 118 compensating for some or all of the delay resulting from the use of those high-threshold devices. Note that transistors MP5A, MN5A, MP5, MN5, and MNAUX are implemented using low-threshold devices, for greater speed.

Depending on the particular implementation, zero, one, or both of inverters IINT and ISIO can be implemented as high-performance inverters using low-threshold devices. Otherwise, they are implemented as low-power inverters using high-threshold devices.

Note that, as described in the previous section, when stage control signal INS_EN is disabled (e.g., high), then hysteresis stage output signal M4OUT is low, which ultimately causes output data signal INSIO_OUT also to be low. Thus, when VCCIO-powered buffer stage 110 is disabled, then output data signal INSIO_OUT is low.

VCC-Powered Buffer Stage

Figure 7:
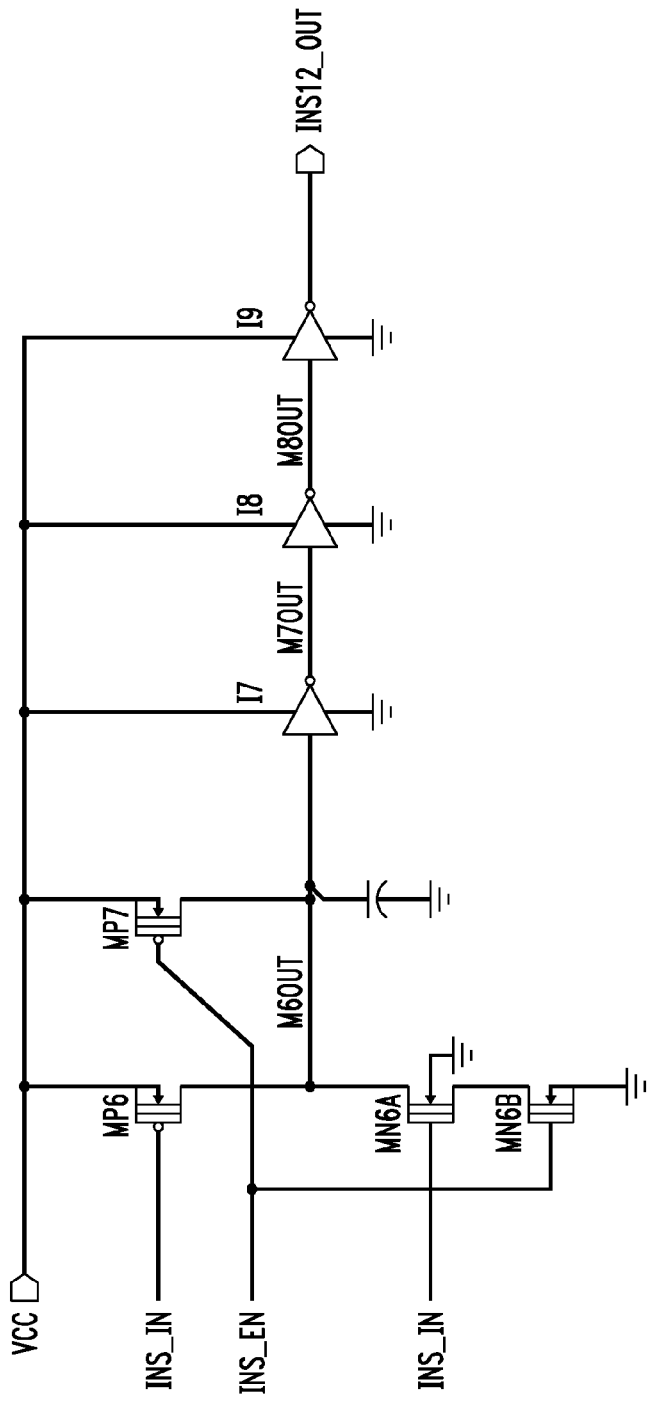
FIG. 7 shows a detailed schematic diagram of the VCC-powered buffer stage of FIG. 1 (i.e., section 122 of FIG. 2)

FIG. 7 shows a detailed schematic diagram of VCC-powered buffer stage 120 of FIG. 1 (i.e., section 122 of FIG. 2). When stage control signal INS_EN is enabled (e.g., low), then weak pull-up transistor MP7 is on, transistor MN6B is off, and VCC-powered buffer stage 120 is disabled. In that case, weak pull-up transistor MP7 drives signal M6OUT toward VCC, which ensures that output data signal INS12_OUT is driven low (via inverters I7, I8, and I9), when VCC-powered buffer stage 120 is disabled.

When stage control signal INS_EN is disabled (e.g., high), then weak pull-up transistor MP7 is off, transistor MN6B is on, and VCC-powered buffer stage 120 is enabled. In that case, transistors MP6 and MN6A function as an inverter that generates inverter output signal M6OUT based on input data signal INS_IN. In particular, when input data signal INS_IN is low, then transistor MP6 is on, transistor MN6A is off, and inverter output signal M6OUT is driven towards VCC. When input data signal INS_IN is high, then transistor MP6 is off, transistor MN6A is on, and inverter output signal M6OUT is driven towards ground.

Driving signal M6OUT towards VCC (high) causes inverters I7, I8, and I9 to drive output data signal INS12_OUT towards ground (low). Analogously, driving signal M6OUT towards ground causes inverters I7, I8, and I9 to drive output data signal INS12_OUT towards VCC.

Note that transistors MP6, MN6A, MN6B, and MP7 are implemented using high-threshold devices. Depending on the particular implementation, zero, one, or more of inverters I7, I8, and I9 can be implemented as high-performance inverters using low-threshold devices. Otherwise, they are implemented as low-power inverters using high-threshold devices.

Alternative Embodiments

FIG. 8 shows Table I, which identifies the characteristics of the various transistors, inverters, and transmission gates of input buffer 100 of FIGS. 2-7. Note that inverters and transmission gates are implemented with at least one P-type transistor and at least one N-type transistor. The first number corresponds to the transistor channel length in microns, while the second number refers to the transistor channel width in microns. An asterisk (*) indicates the number of transistors configured in parallel to implement the device. Thus, transistor device MP1C in FIG. 4 is implemented using two parallel P-type transistors, each having a channel length of 7.02 microns and a channel width of 0.35 microns. Similarly, inverter ISIO in FIG. 6 is implemented using (i) seven parallel P-type transistors, each having a channel length of 1.44 microns and a channel width of 0.065 microns, and (ii) six parallel N-type transistors, each having a channel length of 1.25 microns and a channel width of 0.065 microns. Those skilled in the art will understand that, for other implementations, suitable devices with different characteristics can be used.

Those skilled in the art will also understand that guard rings may be implemented around some or even all PFET and NFET regions for latchup-concern, especially around the high-current transistors MP1A, MN1A, MN1B, MP2C, and MN2A. Guard ringing reduces the possibility of intrinsic NPN and PNP pairs turning on inadvertently or accidentally resulting in potentially destructive overcurrents.

In the embodiment shown in FIGS. 2-7, input buffer 100 includes all three of mixed-mode section 114, hysteresis section 116, and the look-ahead circuitry of level-shifting section 118. Those skilled in the art will understand that, in alternative embodiments, input buffers can be implemented with only any one or only any two of those three features. Thus, in general, an input buffer can have mixed-mode section 114 and/or hysteresis section 116 and/or the look-ahead circuitry of level-shifting section 118.

The present invention has been described in the context of a programmable device having a programmable input buffer having a VCC-powered buffer stage and a VCCIO-powered buffer stage. Such a programmable device might or might not have a VCCAUX power supply in addition to the VCC and VCCIO power supplies used by the input buffer. In an alternative embodiment, the programmable device has a VCCAUX power supply, and the input buffer has a VCCAUX-powered buffer stage in addition to the VCC- and VCCIO-powered buffer stages.

Although the present invention has been described in the context of an input buffer that receives an incoming data signal, the present invention can be implemented in the context of buffers for other applications, such as an output buffer that receives an outgoing data signal or an internal buffer that receives a data signal that is neither an incoming data signal or an outgoing data signal.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Signals and corresponding nodes or ports may be referred to by the same name and are interchangeable for purposes here.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Thus, for example, in FIG. 5, the main driver output node INS_IN_N may be said to be connected to the hysteresis section output node M4OUT even though inverter I4 is located between those two nodes.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

It should be appreciated by those of ordinary skill in the art that any block diagrams herein represent conceptual views of illustrative circuitry embodying the principles of the invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a buffer comprising:
   a main driver section having a main driver input node and a main driver output node, the main driver section operable to buffer a data signal received at the input node and provide the buffered data signal at the output node; and
   a hysteresis section connected to the main driver section and responsive to at least one hysteresis control signal to provide any of a plurality of different levels of trip-point hysteresis for the buffered data signal, the level provided depending on the state of the at least one hysteresis control signal.

2. The invention of claim 1, wherein the plurality of different levels of trip-point hysteresis comprise a first small-hysteresis level, a second small-hysteresis level, and a large-hysteresis level, wherein the large-hysteresis level has a trip-point difference substantially equal to a sum of trip-point differences of the first and second small-hysteresis levels,
   wherein the hysteresis section is responsive to at least two hysteresis control signals, each having an enable state and a disable state:
   the first small-hysteresis level being provided when a first hysteresis control signal is enabled and a second hysteresis control signal is disabled;
   the second small-hysteresis level being provided when the first hysteresis control signal is disabled and a second hysteresis control signal is enabled; and
   the large-hysteresis level being provided when the first hysteresis control signal is enabled and a second hysteresis control signal is enabled.

3. The invention of claim 2, wherein the hysteresis section comprises:
   a first inverter having (i) a first inverter input node connected to the main driver output node and (ii) a first inverter output node;
   a P leg having first, second, and third P-type devices having channels connected in series between a power supply high voltage level and the main driver output node, wherein:
   a gate of the first P-type device is connected to the main driver input node;
   a gate of the second P-type device is connected to the first inverter output node; and
   a gate of the third P-type device is connected to a P-leg control signal that selectively enables the P leg; and
   an N leg having first, second, and third N-type devices having channels connected in series between the main driver output node and a power supply low voltage level,
   wherein:
   a gate of the first N-type device is connected to the main driver input node;
   a gate of the second N-type device is connected to the first inverter output node; and
   a gate of the third N-type device is connected to an N-leg control signal that selectively enables the N leg,
   wherein:
   when the P leg and the N leg are both disabled, then the hysteresis section provides zero trip-point hysteresis;
   when the P leg is enabled and the N leg is disabled, then the hysteresis section provides the first small-hysteresis level of trip-point hysteresis for the buffer;
   when the P leg is disabled and the N leg is enabled, then the hysteresis section provides the second small-hysteresis level of trip-point hysteresis; and
   when the P leg and the N leg are both enabled, then the hysteresis section provides the large-hysteresis level of trip-point hysteresis.

4. The invention of claim 3, wherein:
   for the first small-hysteresis level of trip-point hysteresis, (i) a low-to-high trip-point voltage level is greater than a high-to-low trip-point voltage level and (ii) the high-to-low trip-point voltage level for the buffer is substantially equal to a midway voltage level midway between the power supply high voltage level and the power supply low voltage level
   for the second small-hysteresis level of trip-point hysteresis, (i) the low-to-high trip-point voltage level is greater than the high-to-low trip-point voltage level and (ii) low-to-high trip-point voltage level is substantially equal to the midway voltage level; and
   for the large-hysteresis level of trip-point hysteresis, (i) the low-to-high trip-point voltage level is greater than the midway voltage level and (ii) the midway voltage level is greater than the high-to-low trip-point voltage level.

5. The invention of claim 1, wherein:
   the integrated circuit is a field-programmable gate array; and
   the buffer is a programmable input buffer comprising a low-voltage buffer stage and a high-voltage buffer stage comprising the main driver section and the hysteresis section, wherein the programmable input buffer can be selectively configured to enable either the low-voltage buffer stage or the high-voltage buffer stage.

6. The invention of claim 1, wherein:
   the main driver section is operable to invert the received data signal in generating the buffered data signal and to provide the received data signal and the buffered data signal to the hysteresis section; and
   the hysteresis section is operable to invert the buffered data signal when the buffered data signal crosses the provided trip-point hysteresis level.

7. An integrated circuit having a buffer comprising:
   a main driver section having a main driver input node and a main driver output node, the main driver section operable to buffer a data signal received at the input node and provide the buffered data signal at the output node; and
   a mixed-mode section connected to the main driver section and selectively configurable responsive to at least one drive control signal to provide any of a plurality of different mixed modes of operation for the buffer,
   wherein in a first mixed mode of operation the peak voltage of the data signal exceeds the supply voltage for the buffer and in a second mixed mode of operation the peak voltage of the data signal is lower than the supply voltage for the buffer.

8. The invention of claim 7, wherein the buffer further comprises:
a hysteresis section connected to the main driver input node and the main driver output node and selectively configurable to provide any of a plurality of different levels of trip-point hysteresis for the buffer.

9. The invention of claim 7, wherein the plurality of different mixed modes of operation comprise:
first, second, and third over-drive modes, wherein in each over-drive mode the peak voltage of the data signal exceeds the buffer supply voltage by a different amount; and
first, second, and third under-drive modes, wherein in each under-drive mode the peak voltage of the data signal is lower than the buffer supply voltage by a different amount.

10. The invention of claim 7, wherein the mixed-mode section comprises:
one or more switched P-type devices, each having a gate selectively connected to the main driver input node and a drain connected to the main driver output node; and
one or more switched N-type devices, each having a gate selectively connected to the main driver input node and a drain connected to the main driver output node.

11. The invention of claim 10, wherein:
the one or more switched P-type devices comprise a first switched P-type device and a second switched P-type device; and
the one or more switched N-type devices comprise a first switched N-type device and a second switched N-type device.

12. The invention of claim 11, wherein:
the first switched P-type device is smaller than the second switched P-type device; and
the first switched N-type device is smaller than the second switched N-type device.

13. The invention of claim 12, wherein:
if the first switched P-type device is switched in and the second switched P-type device is switched out, then the mixed-mode section provides a first over-drive level for the buffer;
if the first switched P-type device is switched out and the second switched P-type device is switched in, then the mixed-mode section provides a second over-drive level for the buffer greater than the first over-drive level;
if the first switched P-type device and the second switched P-type device are both switched in, then the mixed-mode section provides a third over-drive level for the buffer greater than the second over-drive level;
if the first switched N-type device is switched in and the second switched N-type device is switched out, then the mixed-mode section provides a first under-drive level for the buffer;
if the first switched N-type device is switched out and the second switched N-type device is switched in, then the mixed-mode section provides a second under-drive level for the buffer greater than the first over-drive level; and
if the first switched N-type device and the second switched N-type device are both switched in, then the mixed-mode section provides a third under-drive level for the buffer greater than the second over-drive level.

14. The invention of claim 7, wherein:
the integrated circuit is a field-programmable gate array; and
the buffer is a programmable input buffer comprising a low-voltage buffer stage and a high-voltage buffer stage comprising the main driver section and the mixed-mode section, wherein the programmable input buffer can be selectively configured to enable either the low-voltage buffer stage or the high-voltage buffer stage.

15. An integrated circuit having a buffer comprising:
a main driver section having a main driver input node (e.g., INS_IN) and a main driver output node, the main driver section operable to buffer a data signal received at the input node and provide the buffered data signal at the output node; and
a level-shifting section having an input node at a first voltage domain connected to the main driver output node to receive the buffered data signal and an output node at a second voltage domain different from the first voltage domain to provide the buffered data signal, wherein the level-shifting section comprises:
level-shifting circuitry having an input node at the first voltage domain and an output node at the second voltage domain; and
look-ahead circuitry connected to the input node of the level-shifting section and connected to a downstream node at the second voltage domain, wherein the look-ahead circuitry speeds up switching of the buffered data signal at the downstream node based on a transition of the buffered data signal at the input node of the level-shifting section.

16. The invention of claim 15, wherein the buffer further comprises:
a hysteresis section connected to the main driver section and selectively configurable to provide any of a plurality of different levels of trip-point hysteresis for the buffer.

17. The invention of claim 15, wherein the buffer further comprises:
a mixed-mode section connected to the main driver input node and the main driver output node and selectively configurable to provide any of a plurality of different mixed modes of operation for the buffer.

18. The invention of claim 15, wherein:
the level-shifting section further comprises a first inverter whose input node is the input node of the level-shifting section and having an output node;
the level-shifting circuitry is a second inverter whose input node is the output node of the first inverter;
the level-shifting section further comprises a third inverter whose input node is the output node of the second inverter and whose output node is the downstream node; and
the look-ahead circuitry is an auxiliary transistor whose gate is connected to the input node of the first inverter and whose channel is connected to the downstream node.

19. The invention of claim 18, wherein:
the auxiliary transistor is an N-type device; and
the N-type device speeds up the switching of the downstream node from high to low based on the transition from low to high at the input node of the level-switching section.

20. The invention of claim 15, wherein the main driver section is implemented using high-threshold devices.

21. The invention of claim 15, wherein:
the integrated circuit is a field-programmable gate array; and
the buffer is a programmable input buffer comprising a low-voltage buffer stage and a high-voltage buffer stage comprising the main driver section and the level-shifting section, wherein the programmable input buffer can be selectively configured to enable either the low-voltage buffer stage or the high-voltage buffer stage.

* * * * *